US011641731B2

(12) United States Patent
Lee

(10) Patent No.: US 11,641,731 B2
(45) Date of Patent: May 2, 2023

(54) DRAM AND MANUFACTURING METHOD THEREFORE

(71) Applicant: Winbond Electronics Corp., Taichung (TW)

(72) Inventor: Shu-Mei Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/340,065

(22) Filed: Jun. 6, 2021

(65) Prior Publication Data

US 2021/0398983 A1    Dec. 23, 2021

(30) Foreign Application Priority Data

Jun. 19, 2020    (TW) .................................. 109120869

(51) Int. Cl.
*H01L 27/108* (2006.01)
(52) U.S. Cl.
CPC .. *H01L 27/10855* (2013.01); *H01L 27/10814* (2013.01); *H01L 27/10885* (2013.01)
(58) Field of Classification Search
None
See application file for complete search history.

(56) References Cited

U.S. PATENT DOCUMENTS

| 9,548,259 | B2 | 1/2017 | Kuroki |  |
|---|---|---|---|---|
| 10,714,483 | B2 * | 7/2020 | Chen | H01L 27/10817 |
| 2002/0034877 | A1 | 3/2002 | Shin et al. |  |
| 2008/0017908 | A1 * | 1/2008 | Cho | H01L 28/90 |
|  |  |  |  | 257/E29.345 |
| 2009/0101968 | A1 | 4/2009 | Sugioka |  |
| 2019/0393320 | A1 | 12/2019 | Yoo et al. |  |
| 2021/0398983 | A1 * | 12/2021 | Lee | H01L 27/10855 |

FOREIGN PATENT DOCUMENTS

TW    200537642    11/2005

OTHER PUBLICATIONS

"Office Action of Taiwan Counterpart Application", dated Apr. 14, 2021, p. 1-p. 5.

* cited by examiner

*Primary Examiner* — Steven M Christopher
(74) *Attorney, Agent, or Firm* — JCIPRNET

(57) ABSTRACT

A DRAM including following components is provided. A bit line stack structure includes a bit line structure and a hard mask layer. The bit line structure is located on the substrate. The hard mask layer is located on the bit line structure. A dielectric layer is located on the bit line stack structure and has an opening. A contact structure is located on the substrate and includes an active region contact and a capacitor contact. The active region contact is located on the substrate. The top surface of the active region contact is exposed by the opening. The capacitor contact is located in the opening over the active region contact. An isolation layer is located between the hard mask layer and the dielectric layer and between the capacitor contact and the bit line stack structure. An etch stop layer is located between the dielectric layer and the isolation layer.

18 Claims, 9 Drawing Sheets

DRAM AND MANUFACTURING METHOD THEREFORE

CROSS-REFERENCE TO RELATED APPLICATION

This application claims the priority benefit of Taiwan application serial No. 109120869, filed on Jun. 19, 2020. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and particularly relates to a dynamic random access memory (DRAM) and a manufacturing method thereof.

Description of Related Art

In the manufacturing process of the DRAM, after the bit line structure is formed, a capacitor contact for electrically connecting the active region contact to the capacitor thereon is formed on the active region contact between adjacent bit line structures. However, in the process of forming the capacitor contact, it is easy to cause a short circuit between the bit line structure and the capacitor contact, or even a short circuit between adjacent active region contacts.

SUMMARY OF THE INVENTION

The invention provides a DRAM and a manufacturing method thereof, which can effectively prevent the above problem of the short circuit.

The invention provides a DRAM, which includes a substrate, a bit line stack structure, a dielectric layer, a contact structure, an isolation layer, and an etch stop layer. The bit line stack structure includes a bit line structure and a hard mask layer. The bit line structure is located on the substrate. The hard mask layer is located on the bit line structure. The dielectric layer is located on the bit line stack structure and has an opening. The contact structure is configured to electrically connect a capacitor to an active region of the substrate. The contact structure is located on the substrate on one side of the bit line stack structure. The contact structure includes an active region contact and a capacitor contact. The active region contact is located on the substrate. The top surface of the active region contact is exposed by the opening. The capacitor contact is located in the opening over the active region contact. The isolation layer is located between the hard mask layer and the dielectric layer and located between the capacitor contact and the bit line stack structure to electrically isolate the capacitor contact from the bit line stack structure. The etch stop layer is located between the dielectric layer and the isolation layer. The area of the isolation layer exposed by the opening is greater than the area of the etch stop layer exposed by the opening. The material of the etch stop layer is different from the material of the isolation layer.

The invention provides a method of manufacturing a DRAM, which includes the following steps. A substrate is provided. A bit line stack structure if formed on the substrate. The bit line stack structure includes a bit line structure and a hard mask layer. The bit line structure is located on the substrate. The hard mask layer is located on the bit line structure. An active region contact is formed on the substrate on one side of the bit line stack structure. An isolation material layer is conformally formed on the hard mask layer and the active region contact. An etch stop material layer is conformally formed on the isolation material layer. The material of the etch stop material layer is different from the material of the isolation material layer. A dielectric layer is formed on the etch stop material layer. An opening is formed in the dielectric layer. The opening exposes the etch stop material layer located on the sidewall of the hard mask layer and located above the active region contact. A portion of the etch stop material layer exposed by the opening is removed to form an etch stop layer and to cause the opening to expose the isolation material layer located on the sidewall of the hard mask layer and located on the active region contact. A portion of the isolation material layer located on the active region contact is removed to form an isolation layer and to cause the opening to expose the active region contact. A capacitor contact is formed in the opening.

Based on the above description, in the DRAM and the manufacturing method thereof according to the invention, since the isolation layer is located between the capacitor contact and the bit line structure, the isolation layer can effectively prevent the problem of the short circuit between the bit line structure and the capacitor contact for electrically connecting to the capacitor, thereby improving the reliability of the DRAM.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
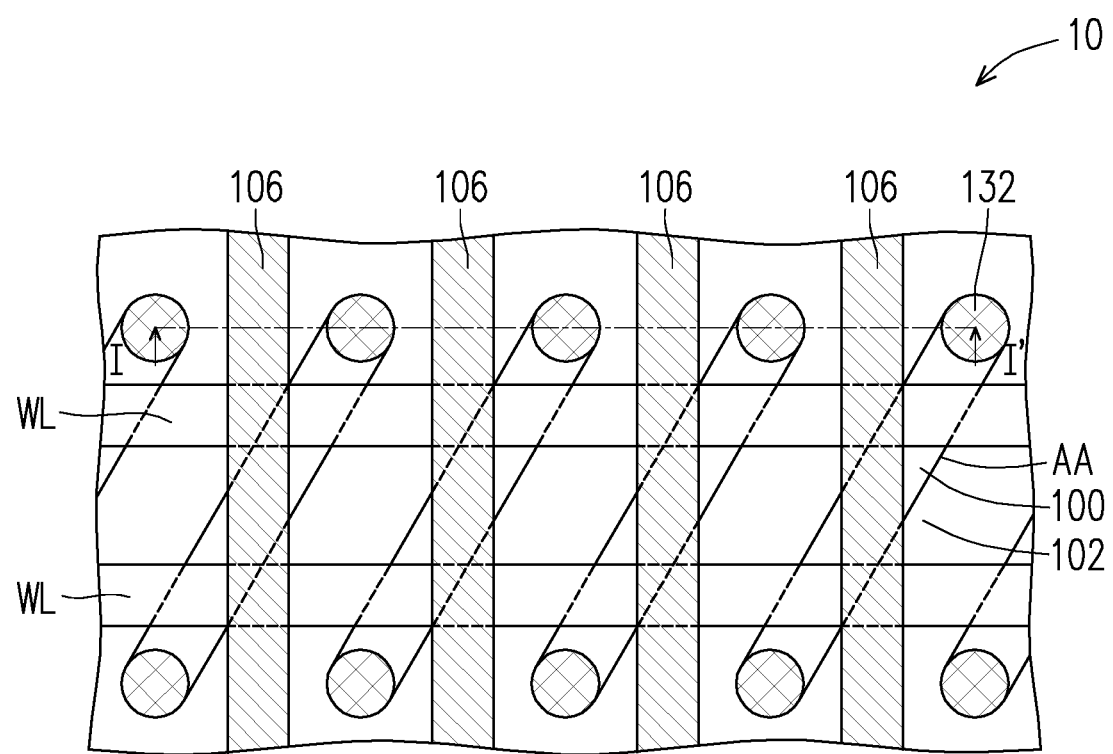
FIG. 1 is a top view illustrating a DRAM according to an embodiment of the invention.

FIG. 1 is a top view illustrating a DRAM according to an embodiment of the invention. FIG. 2A to FIG. 2H are cross-sectional views illustrating a manufacturing process of the DRAM along section line I-I' in FIG. 1. In order to clearly illustrate the relationship between the components, some components in the cross-sectional view of FIG. 2H are omitted in the top view of FIG. 1.

Figure 2A:
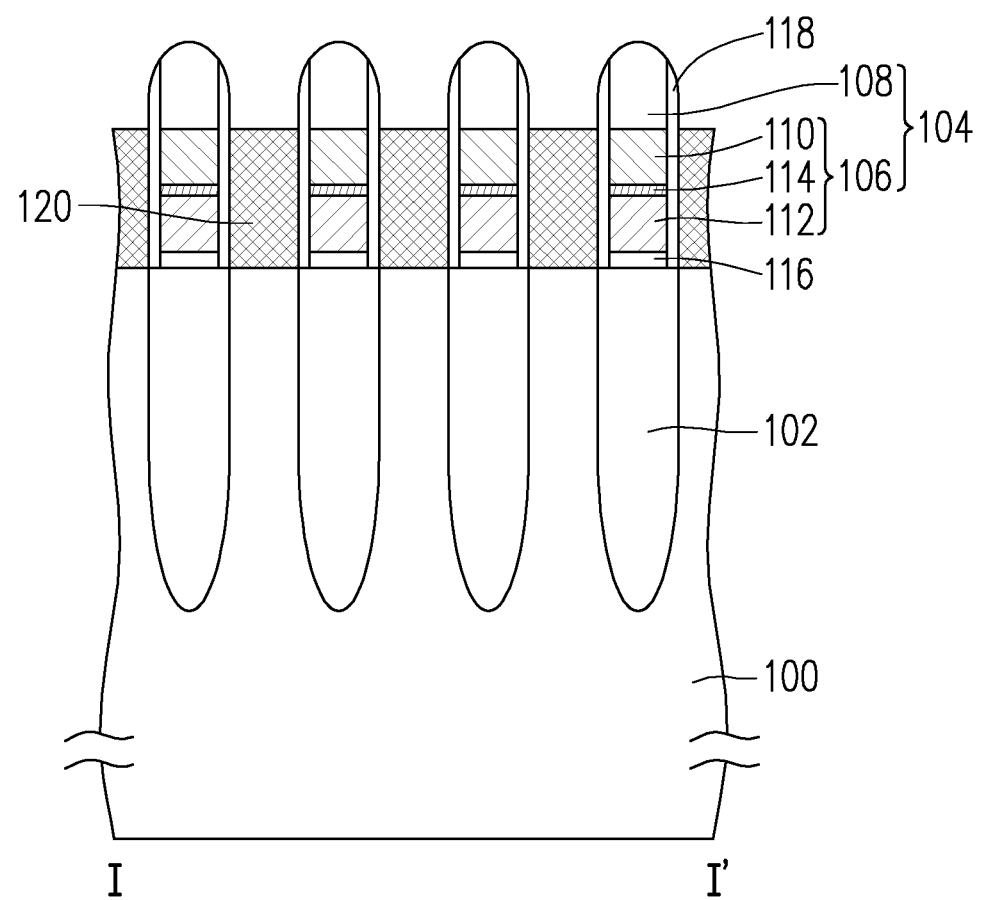
FIG. 2A to FIG. 2H are cross-sectional views illustrating a manufacturing process of the DRAM along section line I-I' in FIG. 1.

Referring to FIG. 1 and FIG. 2A, a substrate 100 is provided. The substrate 100 may be a semiconductor substrate such as a silicon substrate. There may be an isolation structure 102 in the substrate 100. The isolation structure 102 is, for example, a shallow trench isolation (STI) structure. The material of the isolation structure 102 is, for example, silicon oxide. In addition, the word line WL passing through the active region AA may be formed. The word line WL may be isolated from the active region AA of the substrate 100 by a dielectric material (not shown). The word line WL may be a buried word line located in the substrate 100, but the invention is not limited thereto. The material of the buried word line is, for example, tungsten (W). Furthermore, the desired doped regions (not shown) may be formed in the substrate 100 according to requirements.

A bit line stack structure 104 is formed on the substrate 100. The bit line stack structure 104 includes a bit line structure 106 and a hard mask layer 108. The bit line structure 106 is located on the substrate 100. Moreover, a portion of the bit line structure 106 may be located on the isolation structure 102, and a portion of the bit line structure 106 may be located on the active region AA to electrically connected to the doped region in the substrate 100. The hard mask layer 108 is located on the bit line structure 106. The material of the hard mask layer 108 is, for example, silicon nitride.

The bit line structure 106 includes a conductive line 110. The conductive line 110 is located on the substrate 100. The material of the conductive line 110 is, for example, metal such as tungsten. The bit line structure 106 may further include at least one of a contact 112 and a barrier layer 114. The contact 112 is located between the conductive line 110 and the substrate 100. In the active region AA of FIG. 1, the contact 112 of the bit line structure 106 can electrically connect the conductive line 110 to the doped region in the substrate 100. The contact 112 may be strip-shaped or column-shaped. In the present embodiment, the contact 112 is, for example, strip-shaped, so that the contact 112 can extend above the active region AA and the isolation structure 102. In other embodiments, when the contact 112 is column-shaped, the contact 112 is located in the active region AA, but not located above the isolation structure 102. The material of the contact 112 is, for example, doped polysilicon. In addition, a dielectric layer 116 may be formed between the contact 112 and the isolation structure 102. The material of the dielectric layer 116 is, for example, silicon oxide. The barrier layer 114 is located between the conductive line 110 and the contact 112. The material of the barrier layer 114 is, for example, titanium (Ti), titanium nitride (TiN), or a combination thereof. Furthermore, a spacer 118 may be formed on the sidewall of the bit line stack structure 104. The material of the spacer 118 is, for example, silicon nitride.

Moreover, an active region contact 120 may be formed on the substrate 100 on one side of the bit line stack structure 104 to electrically connect the capacitor contact 130a (FIG. 2G) subsequently formed over the active region contact 120 to the doped region (active region AA) in the substrate 100. The top surface of the active region contact 120 may be equal to or higher than the top surface of the contact 112. In the present embodiment, the top surface of the active region contact 120 is, for example, higher than the top surface of the contact 112, but the invention is not limited thereto. The material of the active region contact 120 is, for example, doped polysilicon. Furthermore, the spacer 118 may be located between the bit line structure 106 and the active region contact 120.

Figure 2B:
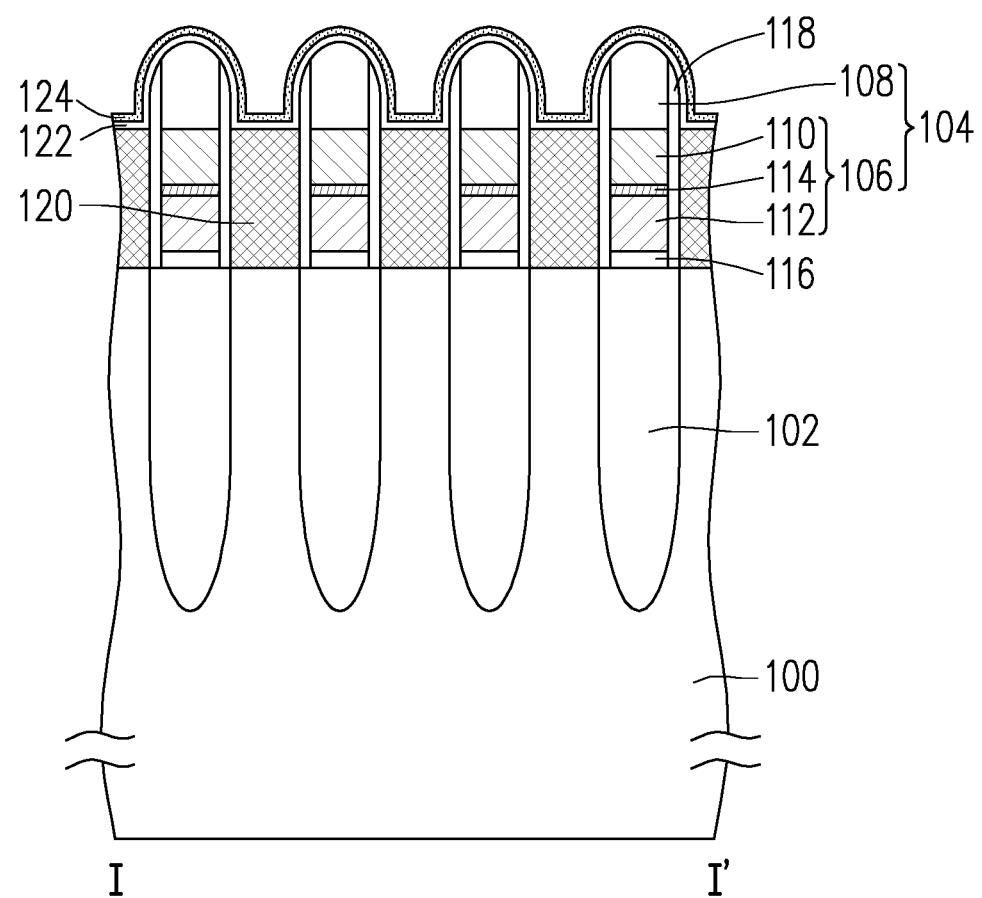

Referring to FIG. 2B, an isolation material layer 122 is conformally formed on the hard mask layer 108 and the active region contact 120. The material of the isolation material layer 122 is, for example, silicon oxide. The method of forming the isolation material layer 122 is, for example, an ultra low temperature oxide (ULTO) deposition method.

An etch stop material layer 124 is conformally formed on the isolation material layer 122. The material of the etch stop material layer 124 is different from the material of the isolation material layer 122. The material of the etch stop material layer 124 is, for example, silicon nitride. The method of forming the etch stop material layer 124 is, for example, low pressure chemical vapor deposition (LPCVD).

Figure 2C:
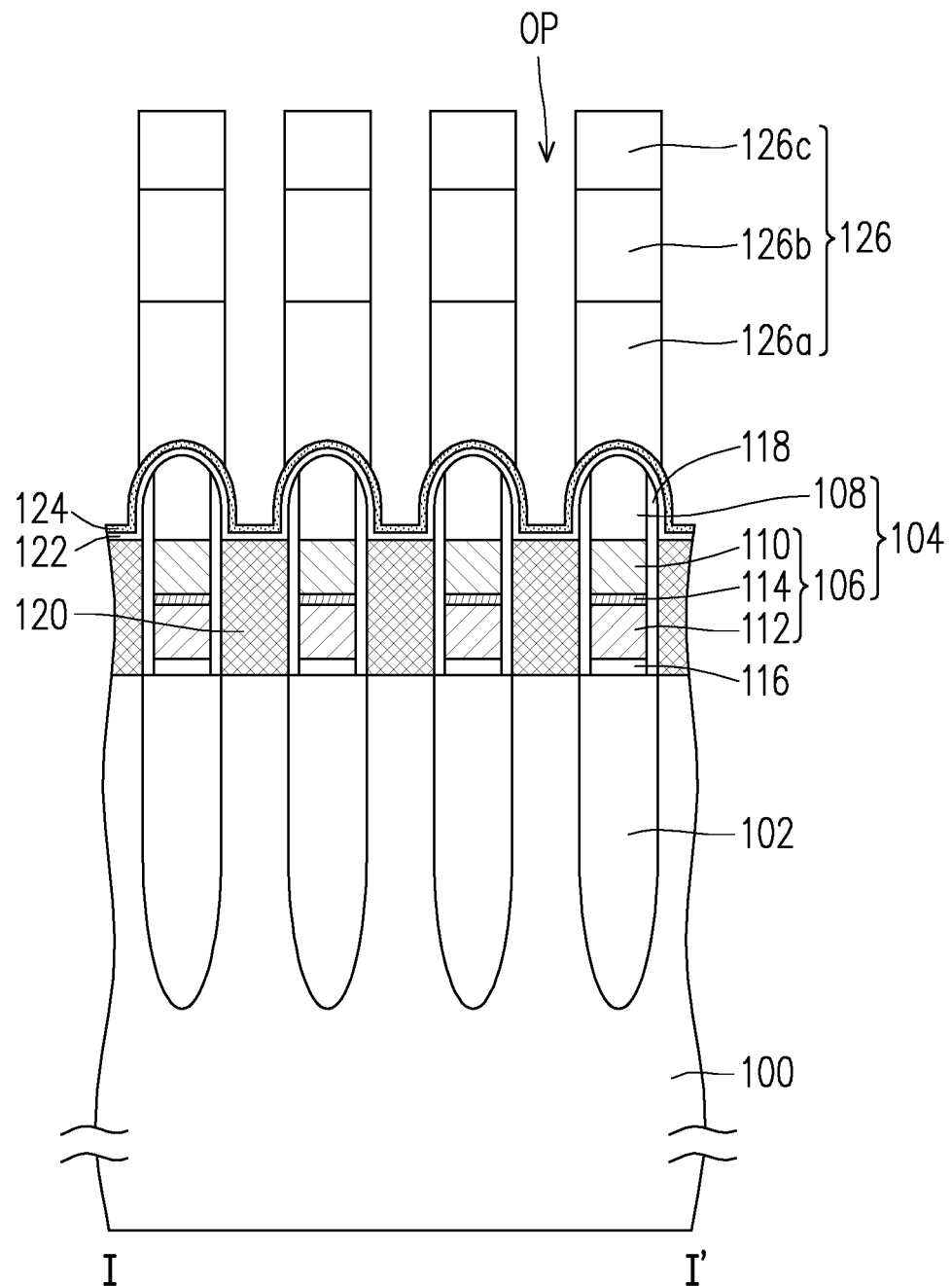

Referring to FIG. 2C, a dielectric layer 126 is formed on the etch stop material layer 124. The dielectric layer 126 may be a single-layer structure or a multilayer structure. For example, the dielectric layer 126 may be a multilayer structure including a dielectric layer 126a, a dielectric layer 126b, and a dielectric layer 126c. The material of the dielectric layer 126a is, for example, silicon oxide. The method of forming the dielectric layer 126a is, for example, LPCVD. The material of the dielectric layer 126b is, for example, silicon oxide. The method of forming the dielectric layer 126b is, for example, high-density plasma chemical vapor deposition (HDPCVD). The material of the dielectric layer 126c is, for example, silicon nitride. The method of forming the dielectric layer 126c is, for example, chemical vapor deposition (CVD). In the present embodiment, although the dielectric layer 126 is, for example, a three-layer structure, the invention is not limited to this.

An opening OP is formed in the dielectric layer 126. The opening OP exposes the etch stop material layer 124 located on the sidewall of the hard mask layer 108 and located above the active region contact 120. The method of forming the opening OP is, for example, patterning the dielectric layer 126 by a lithography process and an etching process. The etching process is, for example, a dry etching process. In addition, the etching process for forming the opening OP may be stopped at the etch stop material layer 124, thereby preventing the isolation material layer 122 from being damaged during the etching process.

Figure 2D:
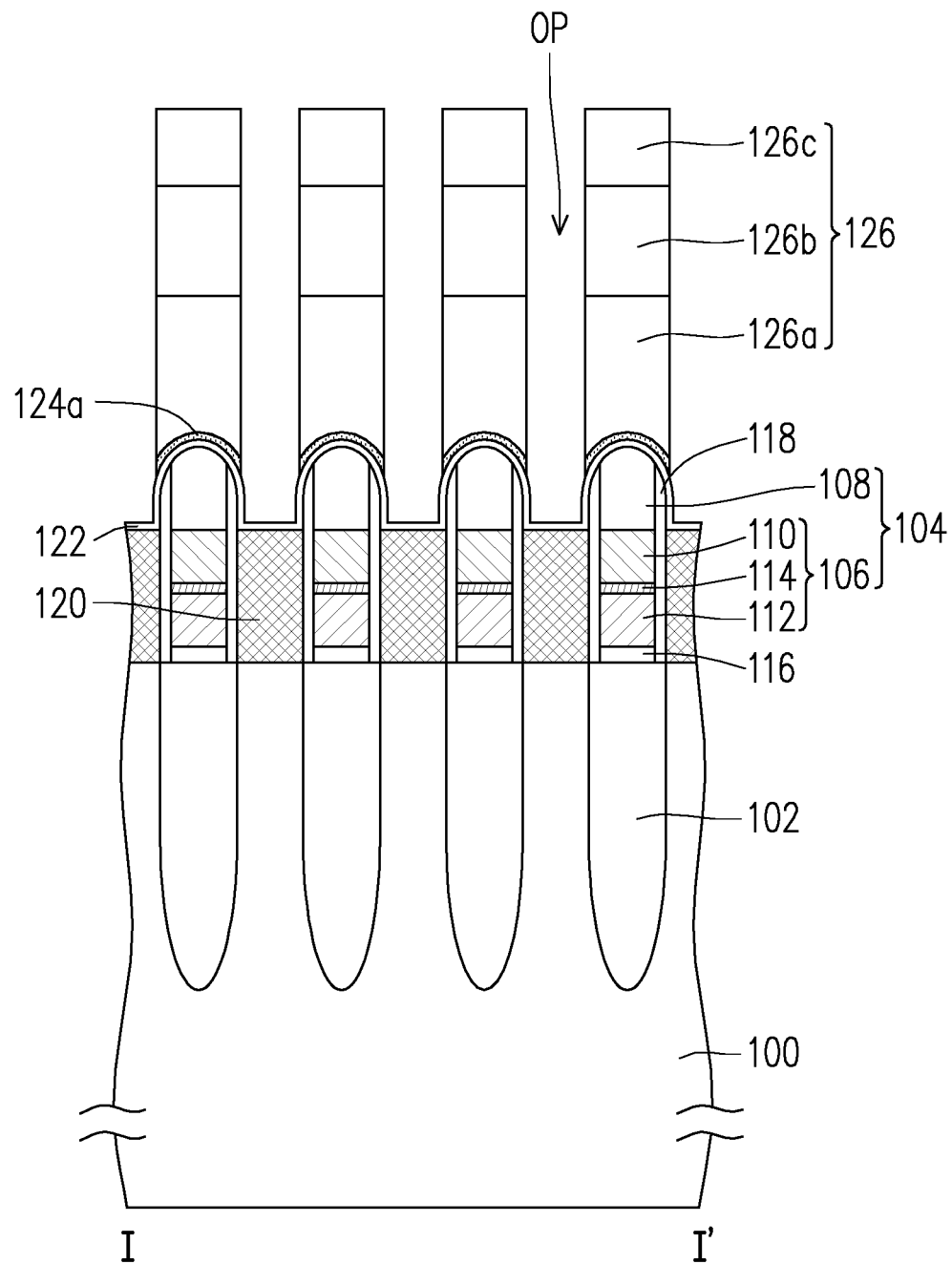

Referring to FIG. 2D, a portion of the etch stop material layer 124 exposed by the opening OP is removed to form an etch stop layer 124a and to cause the opening OP to expose the isolation material layer 122 located on the sidewall of the hard mask layer 108 and located on the active region contact 120. The method of removing the portion of the etch stop material layer 124 is, for example, a wet etching method. When the material of the etch stop material layer 124 is silicon nitride, the etchant used in the wet etching method is, for example, phosphoric acid.

Figure 2E:
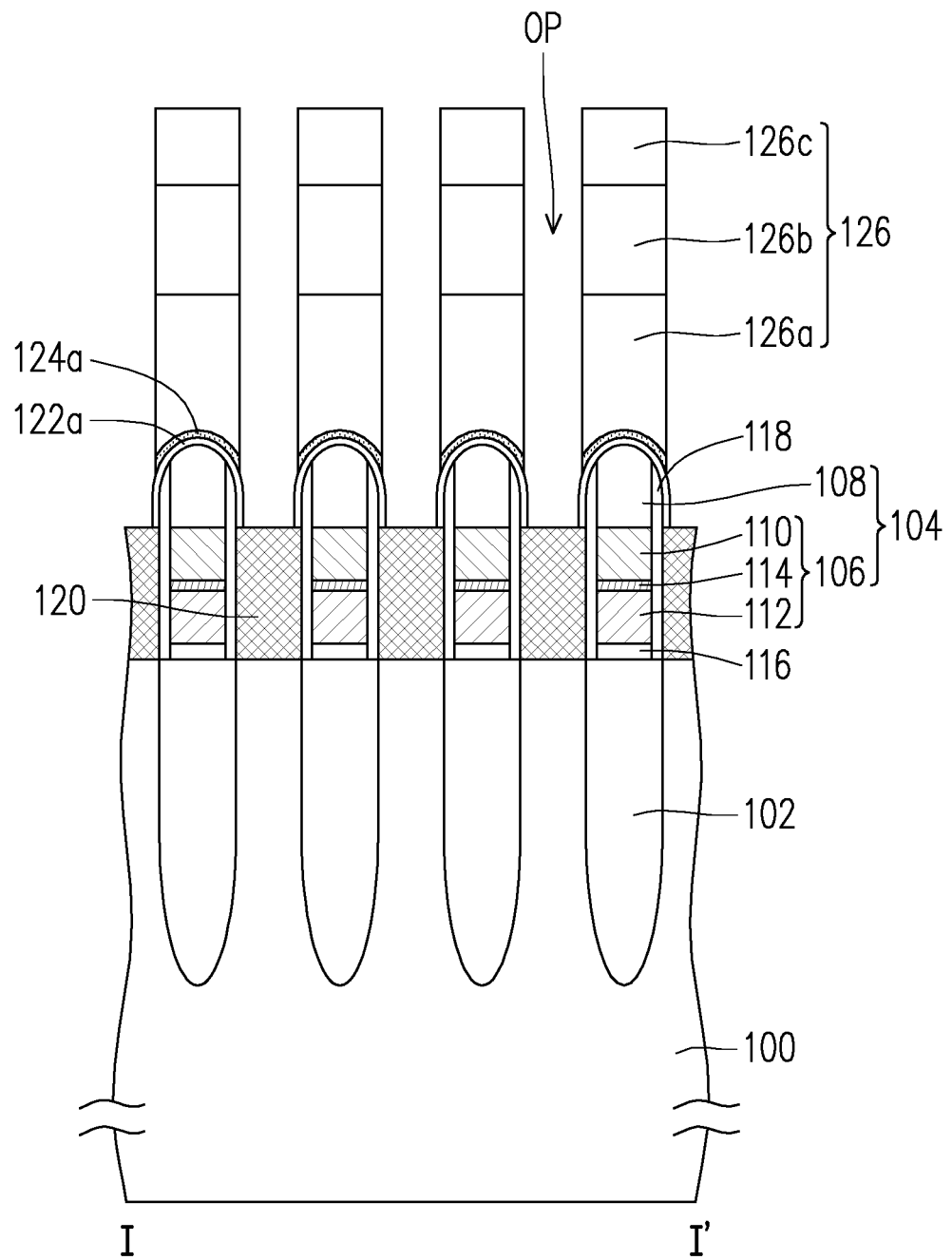

Referring to FIG. 2E, a portion of the isolation material layer 122 located on the active region contact 120 is removed to form an isolation layer 122a and to cause the opening OP to expose the active region contact 120. The isolation layer 122a is located on a portion of the top surface of the active region contact 120. That is, the width of the bottom surface of the opening OP is smaller than the width of the top surface of the active region contact 120. The method of removing the portion of the isolation material layer 122 is, for example, a dry etching method.

Figure 2F:
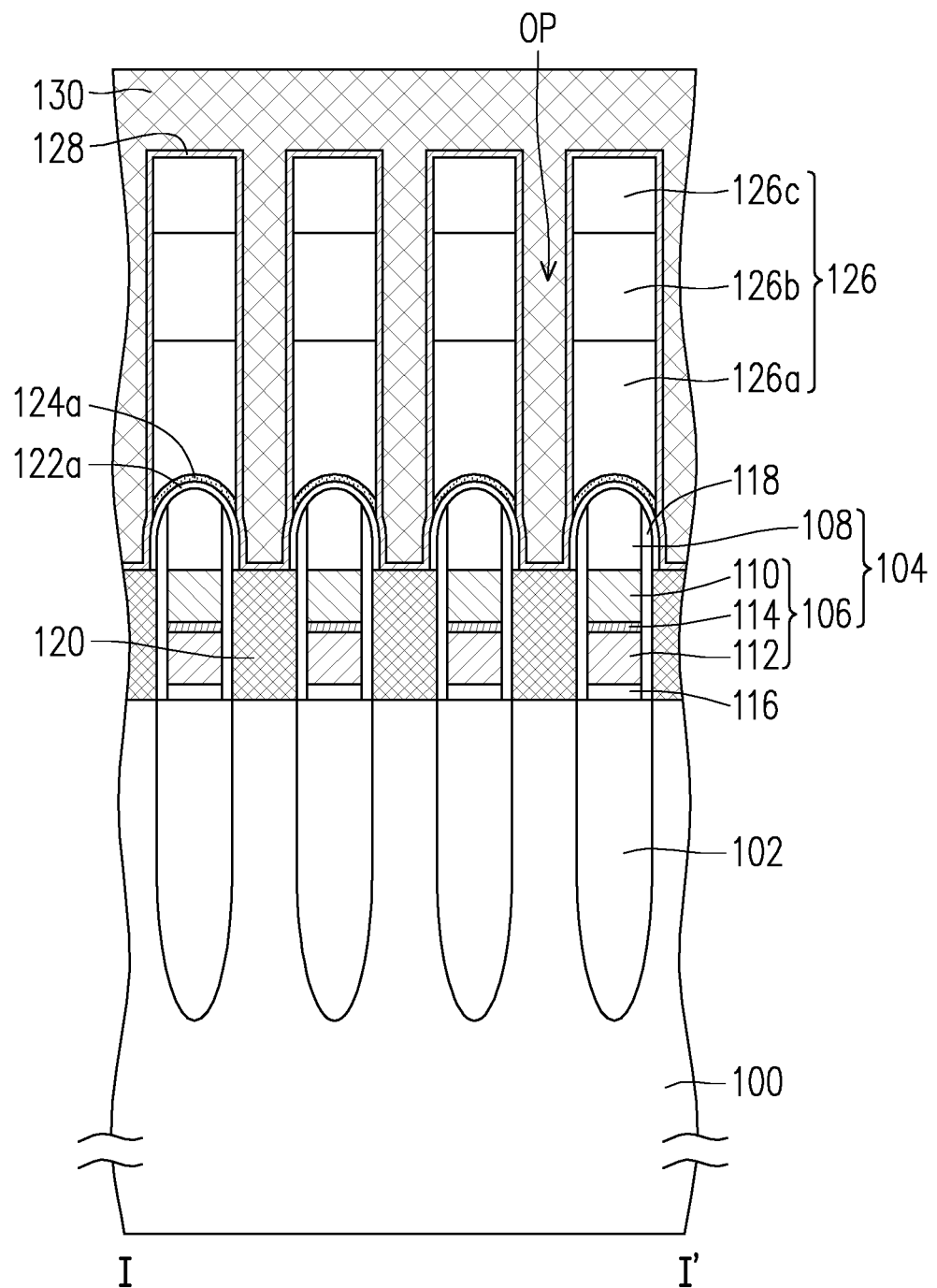

Referring to FIG. 2F, a barrier material layer 128 may be conformally formed on the surface of the opening OP. The material of the barrier material layer 128 is, for example, Ti, TiN, or a combination thereof. The method of forming the barrier material layer 128 is, for example, physical vapor deposition (PVD) or atomic layer deposition (ALD).

A conductive layer 130 filled in the opening OP may be formed. The conductive layer 130 may be located on the barrier material layer 128. The material of the conductive layer 130 is, for example, metal such as tungsten. The method of forming the conductive layer 130 is, for example, PVD or CVD.

Figure 2G:
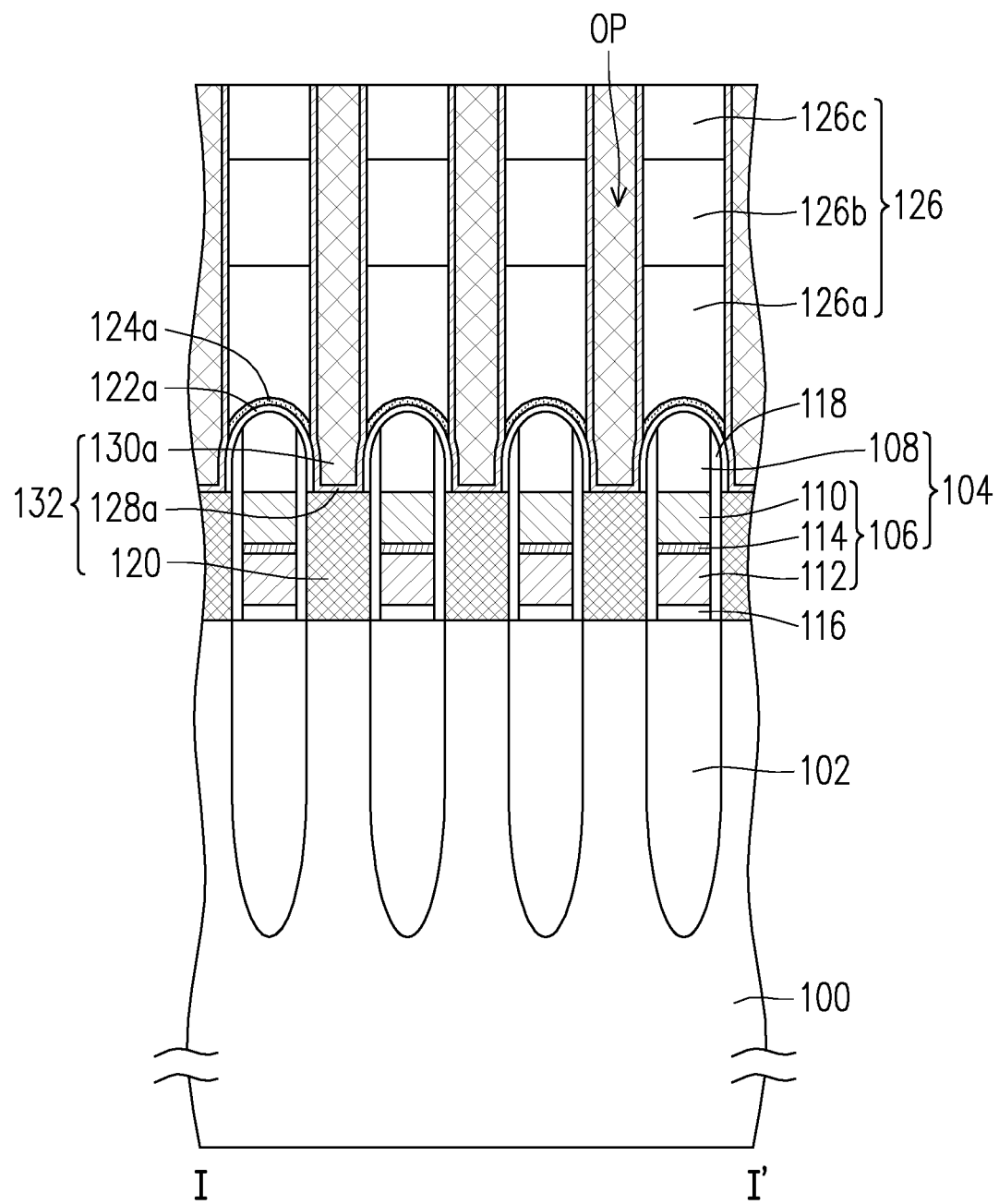
Figure 2H:
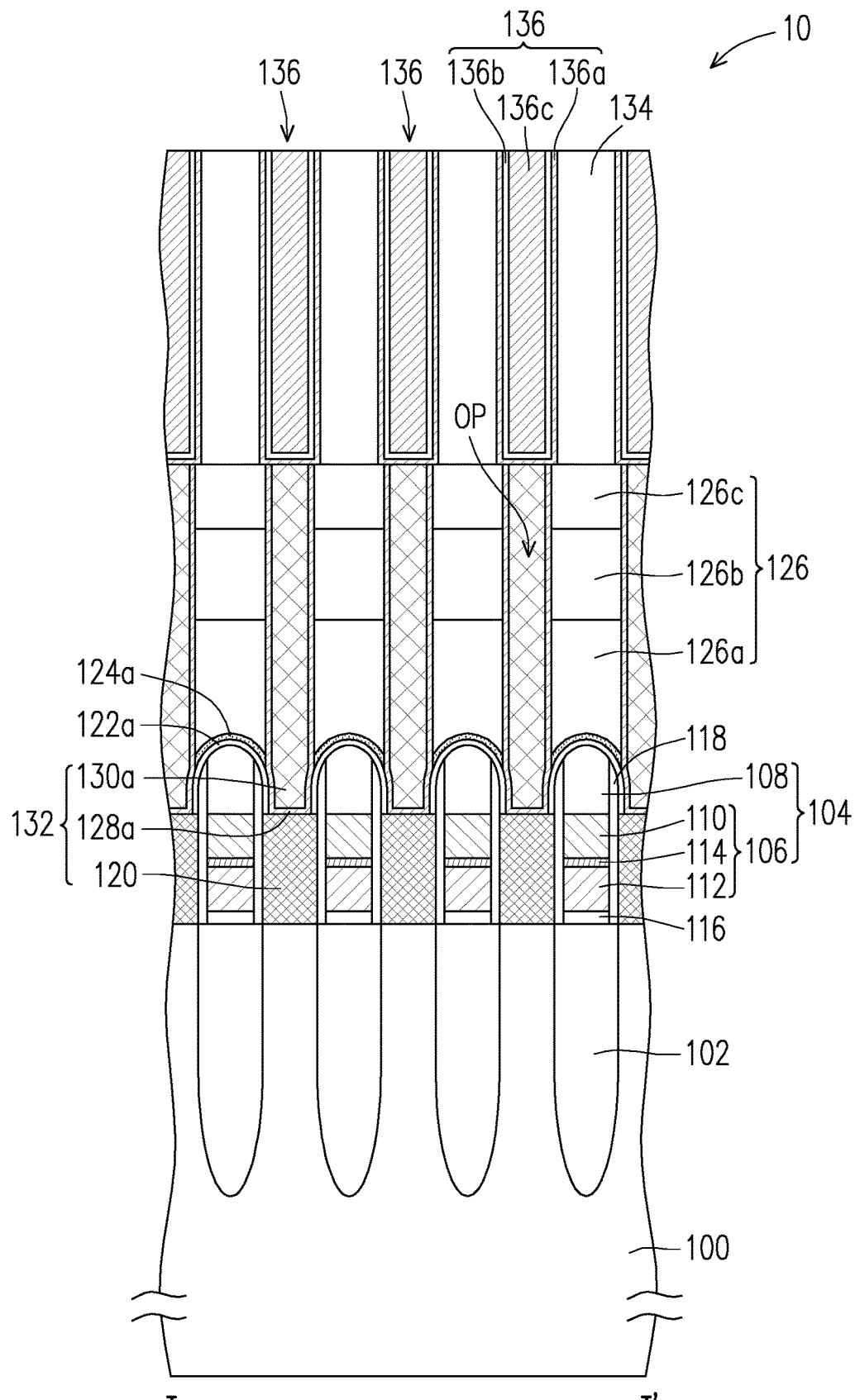

Referring to FIG. 2G the conductive layer 130 located outside the opening OP is removed, and a capacitor contact 130a is formed in the opening OP to electrically connect the active region contact 120 to the capacitor 136 (FIG. 2H)

subsequently formed above the capacitor contact 130a. The method of removing the conductive layer 130 outside the opening OP is, for example, chemical mechanical polishing (CMP).

In addition, after removing the conductive layer 130 located outside the opening OP, the barrier material layer 128 located outside the opening OP is removed to form a barrier layer 128a. The barrier layer 128a, the capacitor contact 130a, and the dielectric layer 126 may be coplanar. The barrier layer 128a may be located on the surface of the opening OP and may be located between the capacitor contact 130a and the active region contact 120. The method of removing the barrier material layer 128 outside the opening OP is, for example, CMP.

In this way, a contact structure 132 may be formed on the substrate 100 on one side of the bit line stack structure 104 by the above method. The contact structure 132 may include the active region contact 120 and the capacitor contact 130a. The contact structure 132 may further include the barrier layer 128a. The active region contact 120 is located on the substrate 100. The capacitor contact 130a is located on the active region contact 120. The barrier layer 128a may be located between the capacitor contact 130a and the active region contact 120. In addition, the isolation layer 122a may be formed between the capacitor contact 130a and the bit line stack structure 104 by the above method. Specifically, the isolation layer 122a may be formed on the top surface and the sidewall of the hard mask layer 108. Since the isolation layer 122a is located between the capacitor contact 130a and the bit line stack structure 104, the isolation layer 122a can isolate the bit line structure 106 from the capacitor contact 130a, thereby effectively preventing the problem of the short circuit between the bit line structure 106 and the capacitor contact 130a. Furthermore, the isolation layer 122a and the etch stop layer 124a may be formed between the hard mask layer 108 and the dielectric layer 126 used to define the opening OP by the above method. In the present embodiment, although the method of forming the isolation layer 122a, the etch stop layer 124a, and the contact structure 132 is exemplified by the above method, the invention is not limited thereto.

After the above structure is formed, other subsequent processes may also be performed. For example, as shown in FIG. 2H, after the steps described in FIG. 2G an interlayer dielectric layer 134 and a capacitor 136 located in the interlayer dielectric layer 134 may be formed. The capacitor 136 may include a lower electrode 136a, a capacitor dielectric layer 136b, and an upper electrode 136c. The structure of the capacitor 136 is for example only, and the invention is not limited thereto. The lower electrode 136a of the capacitor 136 is connected to the capacitor contact 130a, so that the capacitor 136 can be electrically connected to the substrate 100 via the capacitor contact 130a and the active region contact 120. Since the processes for forming the interlayer dielectric layer 134 and the capacitor 136 are well known to one of ordinary skill in the art, the description thereof is omitted here.

Hereinafter, the DRAM 10 of the present embodiment is described with reference to FIG. 1 and FIG. 2H. In the present embodiment, although the method of forming the DRAM 10 is described by taking the above method as an example, the invention is not limited thereto.

Referring to FIG. 1 and FIG. 2H, the DRAM 10 includes the substrate 100, the bit line stack structure 104, the dielectric layer 126, the contact structure 132, the isolation layer 122a, and the etch stop layer 124a. The DRAM 10 may further include the spacer 118. The bit line stack structure 104 includes the bit line structure 106 and the hard mask layer 108. The bit line structure 106 is located on the substrate 100. The bit line structure 106 includes the conductive line 110 located on the substrate 100. In addition, the bit line structure 106 may further include at least one of the contact 112 and the barrier layer 114. The contact 112 is located between the conductive line 110 and the substrate 100. The barrier layer 114 is located between the conductive line 110 and the contact 112. The hard mask layer 108 is located on the bit line structure 106. The dielectric layer 126 is located on the bit line stack structure 104 and has the opening OP. The contact structure 132 is configured to electrically connect the capacitor 136 to the active region AA of the substrate 100. The contact structure 132 is located on the substrate 100 on the side of the bit line stack structure 104. The contact structure 132 includes the active region contact 120 and the capacitor contact 130a. The contact structure 132 may further include the barrier layer 128a. The active region contact 120 is located on the substrate 100. The top surface of the active region contact 120 is exposed by the opening OP. The top surface of the active region contact 120 may be equal to or higher than the top surface of the contact 112. The capacitor contact 130a is located in the opening OP over the active region contact 120. The barrier layer 128a is located between the capacitor contact 130a and the active region contact 120. The isolation layer 122a is located between the hard mask layer 108 and the dielectric layer 126 and located between the capacitor contact 130a and the bit line stack structure 104 to electrically isolate the capacitor contact 130a from the bit line stack structure 104. Specifically, the isolation layer 122a is located on the top surface and the sidewall of the hard mask layer 108, and the isolation layer 122a may be further located on a portion of the top surface of the active region contact 120, so that the width of the bottom surface of the capacitor contact 130a is smaller than the width of the top surface of the active region contact 120. The etch stop layer 124a is located between the dielectric layer 126 and the isolation layer 122a. The area of the isolation layer 122a exposed by the opening OP is greater than the area of the etch stop layer 124a exposed by the opening OP. The material of the etch stop layer 124a is different from the material of the isolation layer 122a. For example, the material of the isolation layer 122a may be silicon oxide, and the material of the etch stop layer 124a may be silicon nitride. The spacer 118 is located on the sidewall of the bit line stack structure 104 and may be located between the bit line structure 106 and the contact structure 132.

The remaining components in the DRAM 10 can refer to the description of the above embodiment. In addition, the material, the arrangement, the formation method, and the effect of each component in the DRAM 10 have been described in detail in the aforementioned embodiments, and the description thereof is not repeated here.

Based on the above embodiment, in the DRAM 10 and the manufacturing method thereof, the isolation layer 122a is located between the capacitor contact 130a and the bit line stack structure 104. In this way, the isolation layer 122a can be used to isolate the bit line stack structure 104 from the capacitor contact 130a, so that the problem of the short circuit between the bit line structure 106 and the capacitor contact 130a can be effectively prevented, thereby improving the reliability of the DRAM. Furthermore, the isolation layer 122a and the etch stop layer 124a are formed between the hard mask layer 108 and the dielectric layer 126 used to define the opening OP, so that the problem of the short circuit between the adjacent active region contacts 120 can be prevented, thereby improving the reliability of the DRAM.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a DRAM, comprising:
providing a substrate;
forming a bit line stack structure on the substrate, wherein the bit line stack structure comprises:
a bit line structure located on the substrate; and
a hard mask layer located on the bit line structure;
forming an active region contact on the substrate on one side of the bit line stack structure;
conformally forming an isolation material layer on the hard mask layer and the active region contact;
conformally forming an etch stop material layer on the isolation material layer, wherein a material of the etch stop material layer is different from a material of the isolation material layer;
forming a dielectric layer on the etch stop material layer;
forming an opening in the dielectric layer, wherein the opening exposes the etch stop material layer located on a sidewall of the hard mask layer and located above the active region contact;
removing a portion of the etch stop material layer exposed by the opening to form an etch stop layer and to cause the opening to expose the isolation material layer located on the sidewall of the hard mask layer and located on the active region contact;
removing a portion of the isolation material layer located on the active region contact to form an isolation layer and to cause the opening to expose the active region contact;
forming a capacitor contact in the opening, wherein the isolation layer is located between the hard mask layer and the dielectric layer and located between the capacitor contact and the bit line stack structure; and
forming a capacitor on the capacitor contact, wherein the capacitor comprises:
a lower electrode connected to the capacitor contact;
an upper electrode located on the lower electrode; and
a capacitor dielectric layer located between the upper electrode and the lower electrode.

2. The method of manufacturing the DRAM according to claim 1, wherein a method of removing the portion of the etch stop material layer comprises a wet etching method, and a method of removing the portion of the isolation material layer comprises a dry etching method.

3. The method of manufacturing the DRAM according to claim 1, wherein a material of the isolation material layer comprises silicon oxide, and a material of the etch stop material layer comprises silicon nitride.

4. The method of manufacturing the DRAM according to claim 1, further comprising:
conformally forming a barrier material layer on a surface of the opening before forming the capacitor contact; and
removing the barrier material layer located outside the opening to form a barrier layer, wherein the barrier layer is located between the capacitor contact and the active region contact, and the barrier layer, the capacitor contact, and the dielectric layer are coplanar.

5. The method of manufacturing the DRAM according to claim 1, further comprising:
forming a spacer on a sidewall of the bit line stack structure before forming the active region contact.

6. The method of manufacturing the DRAM according to claim 1, wherein the bit line structure comprises a conductive line, a contact located between the conductive line and the substrate, and a barrier layer located between the conductive line and the contact, and a top surface of the active region contact is equal to or higher than a top surface of the contact.

7. The method of manufacturing the DRAM according to claim 1, wherein a bottom of the isolation layer is lower than a top of the hard mask layer.

8. The method of manufacturing the DRAM according to claim 1, wherein a method of forming the capacitor contact comprises:
forming a conductive layer filling in the opening; and
removing the conductive layer located outside the opening to form the capacitor contact.

9. The method of manufacturing the DRAM according to claim 1, wherein the isolation layer is further located on a portion of a top surface of the active region contact, so that a width of a bottom surface of the capacitor contact is smaller than a width of the top surface of the active region contact.

10. The method of manufacturing the DRAM according to claim 5, wherein the spacer is located between the bit line structure and the contact structure.

11. The method of manufacturing the DRAM according to claim 1, wherein before conformally forming an isolation material layer, a top of the hard mask layer is higher than a top of the active region contact.

12. The method of manufacturing the DRAM according to claim 1, wherein the isolation material layer has a bumpy surface, a top of the isolation material layer is on the hard mask layer, and a bottom of the isolation material layer is on the active region contact.

13. The method of manufacturing the DRAM according to claim 1, wherein the etch stop material layer has a bumpy surface.

14. The method of manufacturing the DRAM according to claim 1, wherein the isolation layer is formed on a top surface and the sidewall of the hard mask layer.

15. A method of manufacturing a DRAM, comprising:
providing a substrate;
forming a bit line stack structure on the substrate, wherein the bit line stack structure comprises:
a bit line structure located on the substrate; and
a hard mask layer located on the bit line structure;
forming an active region contact on the substrate on one side of the bit line stack structure;
conformally forming an isolation material layer on the hard mask layer and the active region contact;
conformally forming an etch stop material layer on the isolation material layer, wherein a material of the etch stop material layer is different from a material of the isolation material layer;
forming a dielectric layer on the etch stop material layer;
forming an opening in the dielectric layer, wherein the opening exposes the etch stop material layer located on a sidewall of the hard mask layer and located above the active region contact;
removing a portion of the etch stop material layer exposed by the opening to form an etch stop layer and to cause the opening to expose the isolation material layer located on the sidewall of the hard mask layer and located on the active region contact;

removing a portion of the isolation material layer located on the active region contact to form an isolation layer and to cause the opening to expose the active region contact; and forming a capacitor contact in the opening, wherein the method of manufacturing the DRAM further comprises:

conformally forming a barrier material layer on a surface of the opening before forming the capacitor contact; and removing the barrier material layer located outside the opening to form a barrier layer, wherein the barrier layer is located between the capacitor contact and the active region contact, and the barrier layer, the capacitor contact, and the dielectric layer are coplanar.

16. The method of manufacturing the DRAM according to claim 15, wherein before conformally forming an isolation material layer, a top of the hard mask layer is higher than a top of the active region contact.

17. The method of manufacturing the DRAM according to claim 15, wherein the isolation material layer has a bumpy surface, a top of the isolation material layer is on the hard mask layer, and a bottom of the isolation material layer is on the active region contact.

18. The method of manufacturing the DRAM according to claim 15, wherein the etch stop material layer has a bumpy surface, and the isolation layer is formed on a top surface and the sidewall of the hard mask layer.

* * * * *